United States Patent
Okita et al.

(10) Patent No.: US 11,125,634 B2
(45) Date of Patent: Sep. 21, 2021

(54) RESIDUAL STRESS ESTIMATION METHOD AND RESIDUAL STRESS ESTIMATION DEVICE

(71) Applicant: KOBE STEEL, LTD., Hyogo (JP)

(72) Inventors: Keisuke Okita, Hyogo (JP); Tomokazu Nakagawa, Tokyo (JP); Mariko Yamada, Hyogo (JP)

(73) Assignee: Kobe Steel, Ltd., Hyogo (JP)

( * ) Notice: Subject to any disclaimer, the term of this patent is extended or adjusted under 35 U.S.C. 154(b) by 384 days.

(21) Appl. No.: 15/554,357

(22) PCT Filed: Feb. 22, 2016

(86) PCT No.: PCT/JP2016/055072
§ 371 (c)(1),
(2) Date: Aug. 29, 2017

(87) PCT Pub. No.: WO2016/140094
PCT Pub. Date: Sep. 9, 2016

(65) Prior Publication Data
US 2018/0038750 A1 Feb. 8, 2018

(30) Foreign Application Priority Data
Mar. 5, 2015 (JP) ............................. JP2015-043081

(51) Int. Cl.
*G01L 5/00* (2006.01)
*G01M 15/04* (2006.01)
*G06F 30/00* (2020.01)

(52) U.S. Cl.
CPC ............ *G01L 5/0047* (2013.01); *G06F 30/00* (2020.01); *G01M 15/042* (2013.01)

(58) Field of Classification Search
CPC .............................. G01L 5/0047; G06F 17/50
See application file for complete search history.

(56) References Cited

U.S. PATENT DOCUMENTS

| 2011/0213594 A1 | 9/2011 | Zhang |
| 2013/0298691 A1 | 11/2013 | Shimanuki |
| 2016/0273979 A1* | 9/2016 | Yamada ................ G01L 5/0047 |

FOREIGN PATENT DOCUMENTS

| CN | 102152016 A | 8/2011 |
| EP | 2363819 A1 | 9/2011 |

(Continued)

OTHER PUBLICATIONS

Hayman, Interferometric Residual-Stress Analysis, WIPO document No. 0127583, pp. 1-29 (Year: 2001).*

(Continued)

*Primary Examiner* — Lisa E Peters
(74) *Attorney, Agent, or Firm* — Studebaker & Brackett PC

(57) ABSTRACT

Provided are a residual stress estimation method and a residual stress estimation device capable of estimating residual stress suitable for a structure in which inherent strain occupied mainly by plastic strain occurs. A constraint condition is introduced to a distribution function used in the residual stress estimation method based on an inherent strain method, the constraint condition being that a plastic-worked structure does not undergo volume change before and after working. Residual stress or elastic strain is measured from a T piece collected from the structure, and a parameter of the distribution function is optimized so as to approximate the inherent strain at each measurement point obtained from the measured value of the residual stress or elastic strain. An estimated value of the residual stress in the structure is calculated using the obtained parameter.

6 Claims, 13 Drawing Sheets

(56) References Cited

FOREIGN PATENT DOCUMENTS

| JP | 2003-121273 A | | 4/2003 |
|----|---------------|---|--------|
| JP | 2005-181172 A | | 7/2005 |
| JP | 2006-155254 A | | 6/2006 |
| JP | 2014215290 A | * | 11/2014 |
| KR | 10-2013-0114725 A | | 10/2013 |

OTHER PUBLICATIONS

Muránsky et al, The effect of plasticity theory on predicted residual stress fields in numerical weld analyses, Computational Materials Science vol. 54, Mar. 2012, pp. 125-134 (Year: 2012).*

Ma et al, Establishment of Computational Welding Mechanics, Transactions of JWRI, vol. 24 No. 2 1995, Welding Research Institute, Osaka University, pp. 73-86 (Year: 1995).*

Nikishkov, Introduction to the Finite Element Method, University of Aizu, pp. 1-45 (Year: 2004).*

Extended European Search Report issued by the European Patent Office dated Oct. 4, 2018, which corresponds to EP16758788.0-1001 and is related to U.S. Appl. No. 15/554,357.

* cited by examiner

EVALUATION SECTION

RESIDUAL STRESS ESTIMATION METHOD AND RESIDUAL STRESS ESTIMATION DEVICE

TECHNICAL FIELD

The present invention relates to a residual stress estimation method and a residual stress estimation device for estimating residual stress of a structure based on an inherent strain method.

BACKGROUND ART

Residual stress generated in a structure causes damage such as fatigue cracks in some cases and it is important to accurately grasp the distribution of the residual stress in the structure. As a method of estimating the residual stress of a structure, there has been known a method using an inherent strain method (for example, see Patent Documents 1 and 2).

In a method of estimating residual stress based on the inherent strain method of the related art, two kinds of cut pieces are cut out from a structure, the elastic strain or residual stress of each cut piece is measured, and the measured value of the elastic strain or residual stress of each cut piece is applied to an inverse analysis process based on a finite element method. In the inverse analysis process, inherent strain is approximated by the least squares method using a distribution function, the inherent strain distribution is determined in the structure, and the residual stress of the structure before cutting is calculated from the obtained inherent strain distribution.

CITATION LIST

Patent Reference

Patent Document 1: JP-A-2005-181172
Patent Document 2: JP-A-2003-121273

SUMMARY OF THE INVENTION

Problems that the Invention is to Solve

A method of estimating residual stress based on the inherent strain method of the related art is also used for estimating residual stress in a structure subjected to plastic working such as roll processing or shot peening in addition to a structure processed by welding or heat treatment. In plastic working, material transformation or creep deformation due to heat does not occur, and all inherent strain is substantially caused by plastic deformation (plastic strain). Further, with regard to the structure processed by welding and heat treatment, most of the inherent strain may be plastic strain in some cases. In the related art, however, there has been no residual stress estimation method optimized for plastic strain.

The present invention has been made in consideration of the above circumstances and a main object thereof is to provide a residual stress estimation method and a residual stress estimation device that can solve the above problems.

Means for Solving the Problems

In order to resolve the problems described above, a residual stress estimation method according to an aspect of the invention includes steps of: determining a parameter of a distribution function, which is introduced as a constraint condition that a structure does not undergo volume change before and after working, to approximate the distribution function to inherent strain distribution in the structure based on a measured value regarding residual stress of the structure, the parameter being included in the distribution function; and estimating the residual stress of the structure based on the distribution function for which the parameter is determined.

In this aspect, the residual stress estimation method may further include a step of acquiring three different components regarding any one of residual stress and elastic strain measured from one cut piece collected from the structure, as the measured value.

In this aspect, the step of acquiring the three components as the measured value may include acquiring direction components in two directions perpendicular to each other regarding any one of the residual stress and the elastic strain measured in one cut face of the cut piece and a shear component in the cut face, as the measured value.

In this aspect, the step of acquiring the three components as the measured value may include, when assumed that the inherent strain is uniformly distributed in one direction, acquiring three components regarding any one of the residual stress and the elastic strain measured in a cut face intersecting the one direction, as the measured value.

In this aspect, the residual stress estimation method may further include a step of, when assumed that the inherent strain is uniformly distributed in one direction, acquiring the measured value measured from one cut piece with respect to one region in which the inherent strain is uniformly distributed.

A residual stress estimation device according to another aspect of the present invention includes: a determination unit that determines a parameter of a distribution function, which is introduced as a constraint condition that a structure does not undergo volume change before and after working, to approximate the distribution function to inherent strain distribution in the structure based on a measured value regarding residual stress of the structure, the parameter being included in the distribution function; an estimated value acquiring unit that acquires the estimated value of the residual stress in the structure based on the distribution function for which the parameter is determined by the determination unit; and a display unit that displays the estimated value acquired by the estimated value acquiring unit.

Advantages of the Invention

According to the present invention, it is possible to estimate residual stress suitable for a structure in which inherent strain occupied mainly by plastic strain occurs.

MODES FOR CARRYING OUT THE INVENTION

Hereinafter, preferred embodiments of the present invention will be described with reference to the drawings.

A residual stress estimation device according to an embodiment of the present invention is intended to estimate residual stress of a structure based on an inherent strain method using incompressibility of a plastic-worked structure, that is, the property that the volume does not change before and after working.

[Configuration of Residual Stress Estimation Device]

Figure 1:
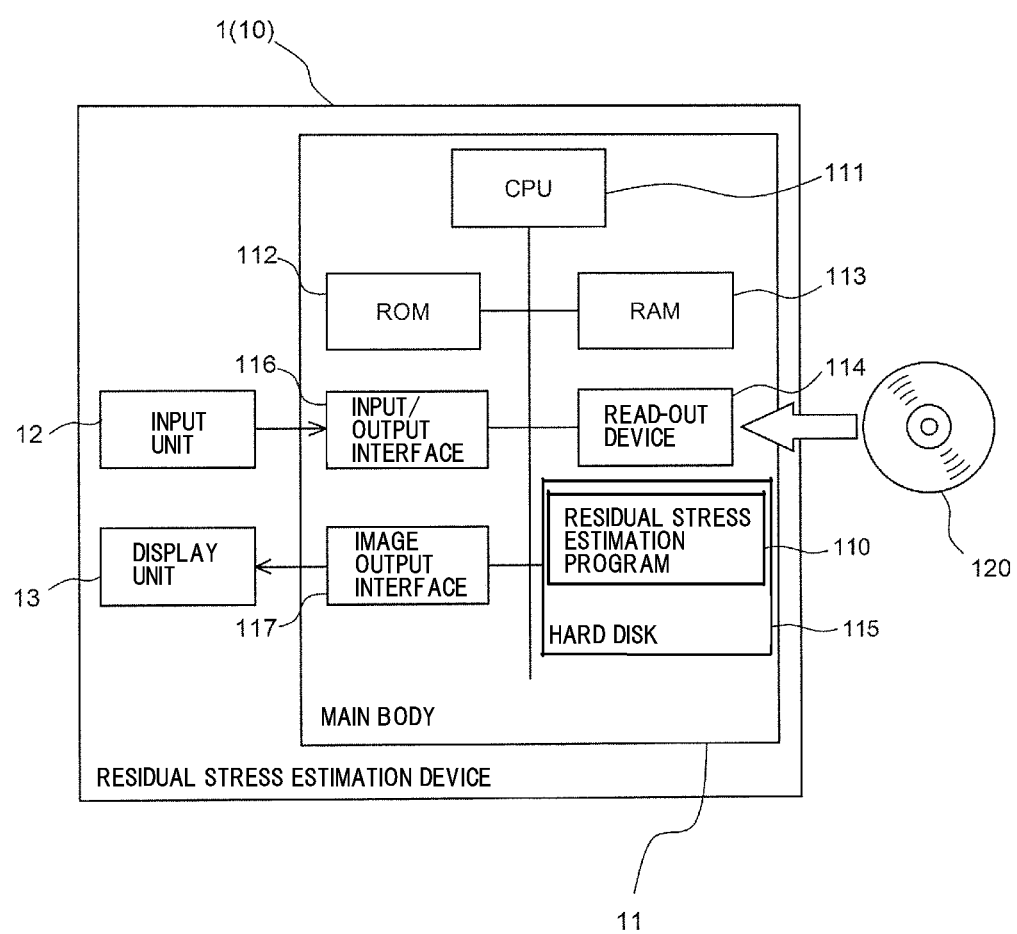
FIG. 1 is a block diagram illustrating a configuration of an embodiment of a residual stress estimation device according to the present invention.

A residual stress estimation device 1 is realized by a computer 10. As illustrated in FIG. 1, the computer 10 includes a main body 11, an input unit 12, and a display unit 13. The main body 11 includes a CPU 111, a ROM 112, a RAM 113, a hard disk 115, a read-out device 114, an input/output interface 116, and an image output interface 117, and the CPU 111, the ROM 112, the RAM 113, the hard disk 115, the read-out device 114, the input/output interface 116, and the image output interface 117 are connected by a bus.

The CPU 111 may execute a computer program loaded on the RAM 113. A residual stress estimation program 110 which is a computer program for residual stress estimation is executed by the CPU 111 and thus the computer 10 functions as the residual stress estimation device 1. The residual stress estimation program 110 is an inverse analysis process program based on a finite element method, and makes it possible to estimate a distribution state of inherent strain in the structure.

The ROM 112 is configured by a mask ROM, a PROM, an EPROM, an EEPROM or the like and is recorded with the computer program to be executed by the CPU 111 and the data used for the same.

The RAM 113 is configured by an SRAM, a DRAM, or the like. The RAM 113 is used to read out the residual stress estimation program 110 recorded in the hard disk 115. When the CPU 111 executes the computer program, the RAM is used as a work region of the CPU 111.

The hard disk 115 is installed with various computer programs to be executed by the CPU 111 such as the operating system, the application program, and the like, and the data used for the execution of an associated computer program. The residual stress estimation program 110 is also installed in this hard disk 115.

The hard disk 115 is installed with an operating system such as Windows (registered trademark) manufactured and sold by US Microsoft Co., for example. In the following description, the residual stress estimation program 110 according to this embodiment is assumed to operate on the operating system.

The read-out device 114 is configured by a flexible disk drive, a CD-ROM drive, a DVD-ROM drive, or the like, and can read out the computer program or the data recorded in a portable recording medium 120. The residual stress estimation program 110 is stored in the portable recording medium 120 to cause the computer to function as the residual stress estimation device. The computer 10 may read out the residual stress estimation program 110 from the portable recording medium 120 and install the residual stress estimation program 110 in the hard disk 115.

The input/output interface 116 is configured by, for example, a serial interface such as an USB, an IEEE 1394, or an RS-232C, or the like, a parallel interface such as a SCSI, an IDE, an IEEE 1284, or the like, and an analog interface including a D/A converter, an A/D converter, and the like. The input unit 12 including a keyboard and a mouse is connected to the input/output interface 116, and a user may input data into the computer 10 by using the input unit 12.

The image output interface 117 is connected to the display unit 13 configured by an LCD, a CRT, or the like, and a video signal according to the image data sent from the CPU 111 is output to the display unit 13. The display unit 13 displays an image (screen) according to the input video signal.

[Principle for Residual Stress Estimation Based on Inherent Strain Method]

(1) Calculation of Residual Stress Using Inherent Strain

When inherent strain is $\varepsilon_0$, residual stress $\sigma$ is expressed by the following expression.

$$\sigma = D(\varepsilon - \varepsilon_0) \quad (1)$$

D represents an elastic coefficient matrix and $\varepsilon$ represents all strain satisfying the relation of the following expression.

[Equation 1]

$$\int B^T \sigma dV = \int B^T D(\varepsilon - \varepsilon_0) dV = 0 \quad (2)$$

Herein, $\int dV$ represents a volume integral in the analysis region and B represents a coefficient matrix for relating a node displacement u and $\varepsilon$.

$$\varepsilon = Bu \quad (3)$$

In a case where the inherent strain is known, residual stress is obtained as follows.

The following expressions are given from Expressions (2) and (3).

[Equation 2]

$$Ku = P \quad (4)$$

where, $$K = \int B^T D B dV \quad (5)$$

$$P = \int B^T D\varepsilon_0 dV \qquad (6)$$

K represents a rigidity matrix and P represents a load vector generated by the inherent strain.

When "u" is obtained by solving Expression (4), residual stress may be obtained from Expressions (3) and (1).

(2) Calculation of Inherent Strain Using Measured Residual Stress

N measured residual stress values are expressed as $\sigma_m$. Correspondingly, N calculated residual stress values obtained from the inherent strain are expressed as $\sigma_c$, and a residue R between the calculated residual stress and the measured residual stress is defined by the following expression.

[Equation 3]

$$R = (\sigma_m - \sigma_c)^T (\sigma_m - \sigma_c) \qquad (7)$$

The inherent strain at a certain point is expressed as the following linear function by M distribution function parameters "a".

[Equation 4]

$$\varepsilon_0 = Ma \qquad (8)$$

where M represents a coordinate function and the coordinates may not be linear.

When the inherent strain is determined by Expression (8), the measured residual stress is obtained by the method of (1) above and as a result, a linear relation equation is obtained as follows.

[Equation 5]

$$\sigma_c = Ha \qquad (9)$$

where H represents a coefficient matrix and the component thereof may be obtained by obtaining residual stress by giving a unit value to each component of a.

When Expression (9) is substituted for Expression (7) and "a" is determined such that R is the minimum, an inherent strain distribution in which an error between the measured residual stress and the calculated residual stress at the measurement point is the minimum is determined.

[Operation of Residual Stress Estimation Device]

Hereinafter, the operation of the residual stress estimation device 1 according to the embodiment will be described.

The residual stress estimation device 1 performs residual stress estimation processing as described below to estimate the residual stress of the structure.

Figure 2:
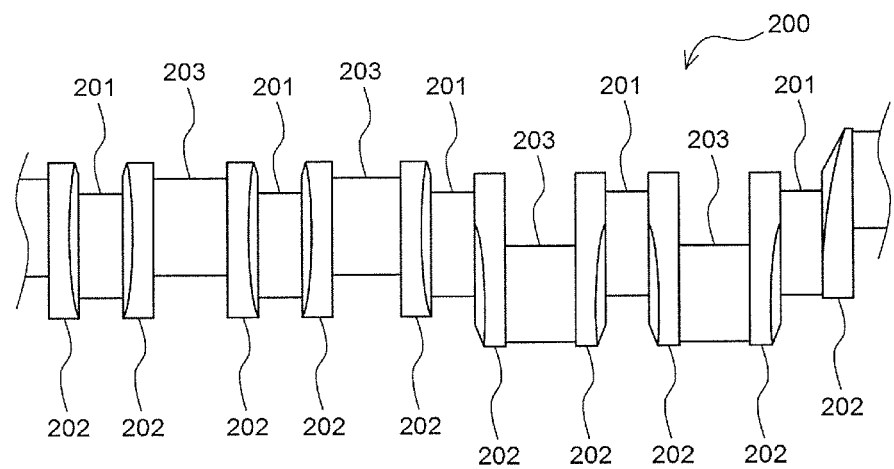
FIG. 2 is a side view illustrating a configuration of a crank shaft.

The structure is formed by plastic working. Herein, a crank shaft will be described as an example of the structure. As illustrated in FIG. 2, a crank shaft 200 is configured such that a journal shaft 201 and a pin shaft 203 are connected by a crank arm 202. In the connection place of the journal shaft 201 and the crank arm 202 and the connection place of the pin shaft 203 and the crank arm 202, great stress is easily generated in use. When tension residual stress is generated in these connection places, damage such as fatigue cracks may be caused. In order to improve fatigue life, plastic working such as roll processing or shot peening is performed on the connection places and compressive residual stress is introduced.

Figure 3:
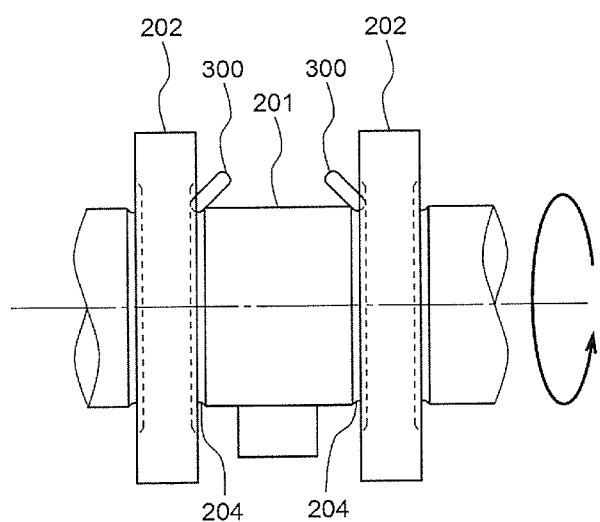
FIG. 3 is an enlarged side view illustrating plastic working for the crank shaft.

FIG. 3 is a view illustrating plastic working with respect to the crank shaft. In FIG. 3, a case of roll processing is illustrated. In the rolling processing, in a state in which a roll 300 is pressed against the connection place of the journal shaft 201 (or the pin shaft 203) and the crank arm 202, the journal shaft 201 is rotated. Thus, in the connection place, a fillet 204 is formed and compressive residual stress is applied such that the residual stress is distributed in the circumferential direction of the journal shaft 201.

Figure 4:
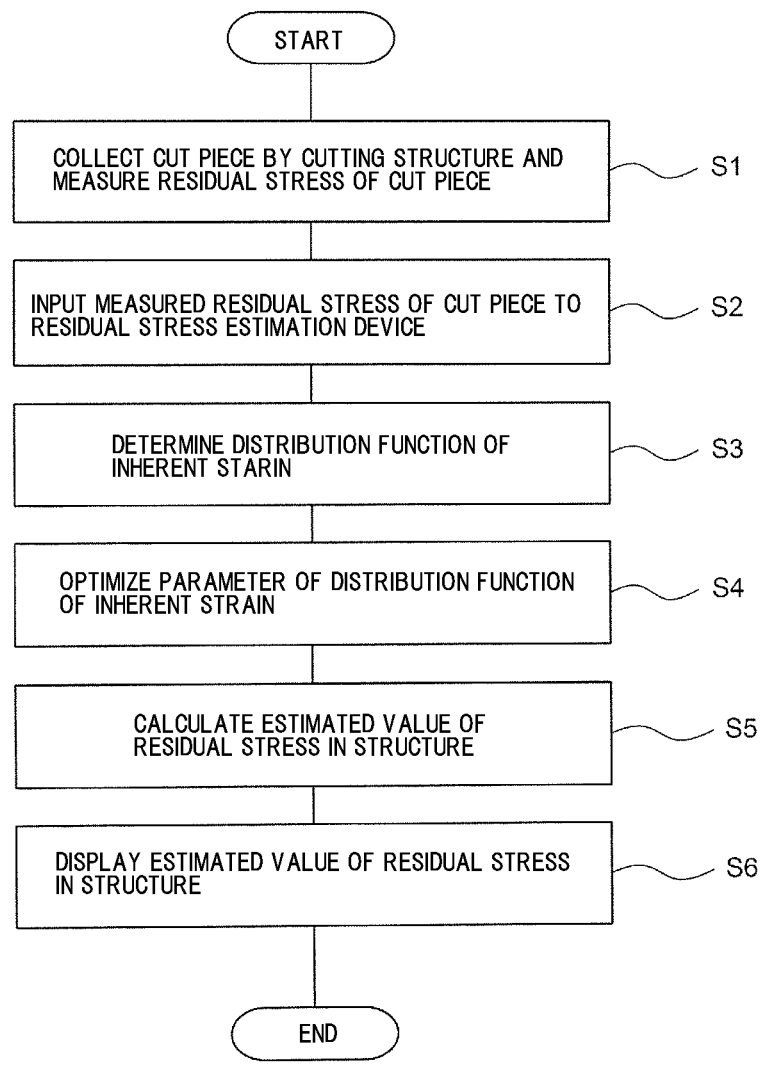
FIG. 4 is a flowchart illustrating the procedure of a residual stress estimation method according to the embodiment of the present invention.

As described above, the residual stress of the structure which is subjected to plastic working is estimated using the residual stress estimation device 1. FIG. 4 is a flowchart illustrating the procedure of a residual stress estimation method according to the embodiment.

A user collects a cut piece by cutting the structure and measures the residual stress from the cut piece (Step S1). Generally, the structure is thinly cut in one direction to collect a cut piece (T piece) and is thinly cut in a direction perpendicular to the one direction to collect a cut piece (L piece).

Here, the residual stress is a value obtained by multiplying elastic strain by a Young's modulus, and measuring elastic strain is equivalent to measuring residual stress. Accordingly, either elastic strain or residual stress may be measured from the cut piece. In the embodiment, a case of measuring the residual stress will be described.

Figure 5:
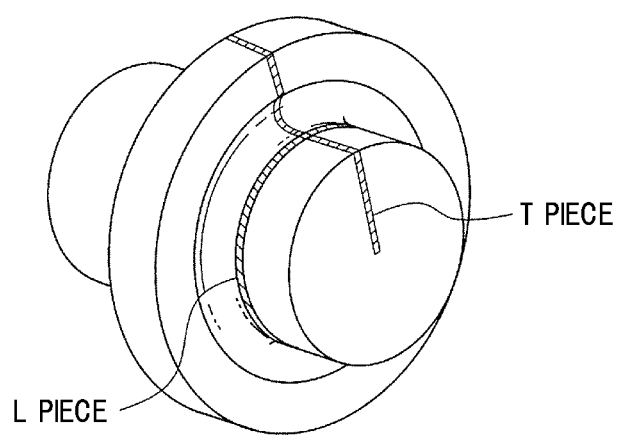
FIG. 5 is a perspective view illustrating an example of a cut piece collected from a structure.

As illustrated in FIG. 5, in the case of an axis-symmetric structure, such as a journal shaft or a pin shaft, to which the compressive residual stress is uniformly applied in the circumferential direction, a T piece is obtained by cutting the structure in a radial direction. If the inherent strain is uniformly distributed in the circumferential direction, even in a case where a T piece is obtained from any portion in the circumferential direction, the inherent strain does not change. Accordingly, the T piece to be collected may be only one. Accordingly, the number of T pieces to be collected can be reduced. Thus, it is possible to reduce the workload of the cutting processing and the measurement of the residual stress of the cut piece.

On the other hand, the inherent strain distribution in the shaft length direction is complicated. Accordingly, it is necessary to collect the L piece in a plurality of places in the shaft length direction.

Figure 6:
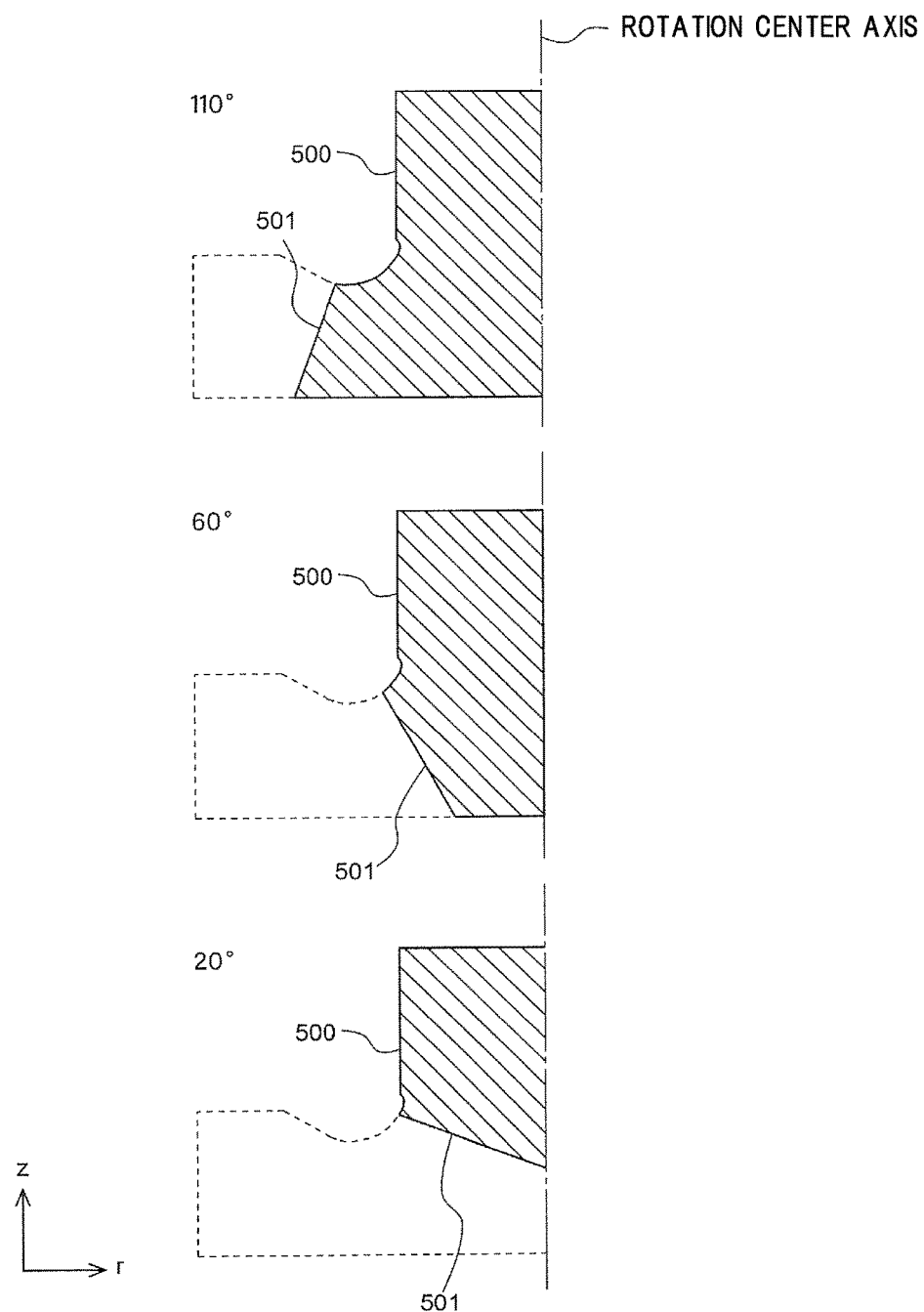
FIG. 6 is a cross-sectional view of a journal shaft for illustrating collection of a C piece.

In a case of having a bent surface like the fillet portion of the crank shaft, instead of the L piece, a conical cut piece (hereinafter, referred to as "C piece") cut in a direction normal to the bent surface may be collected. In FIG. 6, each view is a cross-sectional view when the journal shaft is cut in the rotation axis length direction. A C piece 500 is obtained by cutting the structure in a direction normal to the bent surface of the fillet, that is, in the radius direction of the arc-shaped fillet in the section. Since the journal shaft has an axis-symmetric shape, a cut face 501 of the C piece 500 conically extends around the rotation center axis of the journal shaft. Several C pieces are collected by changing the central angle of the fillet (in FIG. 6, from 20° to 110° with a step of 10°).

In a case where compressive residual stress is uniformly applied to a rod-like structure long in one direction in the longitudinal direction, only one T piece can be collected in one place in the longitudinal direction.

The user directly measures the residual stress of the cut piece collected as described above with X-rays or the like. In the case of measuring the elastic strain, the user attaches a strain gauge to the cut piece and further cuts the cut piece into a plurality of small pieces to measure released strain (elastic strain) of each small piece. In the measurement of the residual stress or released strain (elastic strain), a plurality of components that are different from each other are measured.

Figure 7:
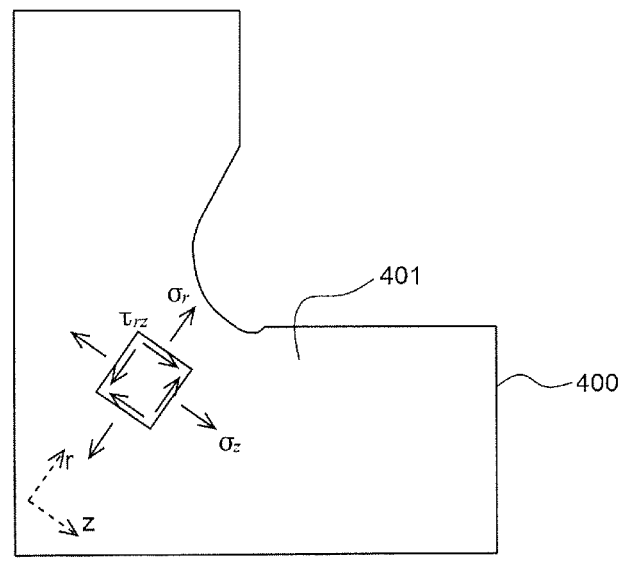
FIG. 7 is a schematic diagram illustrating an example of residual stress measurement of the cut piece.

FIG. 7 illustrates an example of measuring residual stress in a T piece of the fillet portion of the journal shaft (or pin shaft). A T piece 400 has a cut face 401 that is perpendicular to the circumferential direction of the journal shaft (or pin shaft), and the user measures components $\sigma_r$ and $\sigma_z$ in an r-direction and a z-direction perpendicular to each other in the cut face 401. Generally, these two components are measured in the T piece, and two direction components perpendicular to each other are also measured in the L piece (or C piece).

In a case of measuring the residual stress for the T piece 400, a shear component $\tau_{rz}$ as well as the components $\sigma_r$ and $\sigma_z$ can be measured. Thus, three components $\sigma_r$, $\sigma_z$, and $\tau_{rz}$ can be measured with only the T piece 400. The estimation accuracy of the residual stress is improved in the case of using three components compared to the case of using two components of the T piece 400. In addition, it is possible to use the shear component $\tau_{rz}$ instead of collecting the L piece and the C piece. In this case, it is possible to suppress the lowering of the estimation accuracy of the residual stress using the shear component $\tau_{rz}$ instead of using the residual stress component measured from the L piece or the C piece. Further, since the user has a large workload for collecting the cut piece and measuring the residual stress, the workload can be reduced as the number of cut pieces to be collected becomes smaller.

In addition, the residual stress can be estimated by measurement of only two components of the T piece without measurement of the shear component. In this case, the collection of the L piece and the C piece can also be omitted, and the workload is reduced. However, since the residual stress cannot be estimated in consideration of components other than the above two components, the estimation accuracy becomes lower compared with the case of using the shear component $\tau_{rz}$ and the case of collecting the L piece or the C piece.

FIG. 4 is referred to again. The user inputs the residual stress of the cut piece to the residual stress estimation device 1. The CPU 111 of the residual stress estimation device 1 receives the residual stress of the cut piece input from the input unit 12 (Step S2).

Next, the CPU 111 determines a distribution function of the inherent strain (Step S3). As the distribution function, any multi-order polynomial or trigonometrical series can be selected. In this case, the CPU 111 may automatically select the distribution function or the user may designate a desired distribution function using the input unit 12. In the residual stress estimation device 1, the distribution function may be set in advance.

The distribution function determined in Step S3 is optimized for the plastic-worked structure. This will be described below.

Strain due to the work occurs in the structure. In general, the strain is represented by the following expression.

$$\varepsilon = \varepsilon_e + \varepsilon_p + \varepsilon_{th} + \varepsilon_{tr} + \varepsilon_{cr} \quad (10)$$

Where, $\varepsilon_e$ represents elastic strain, $\varepsilon_p$ represents plastic strain, $\varepsilon_{th}$ represents heat strain, $\varepsilon_{tr}$ represents transformation strain, and $\varepsilon_{cr}$ represents creep strain. Here, the inherent strain refers to permanent strain caused inside the structure by a thermally or mechanically external force (non-elastic strain). That is, the sum of non-elastic terms other than $\varepsilon_e$ and $\varepsilon_{th}$ in Expression (10) is the inherent strain.

In the structure subjected to welding or heat treatment, all of the non-elastic terms other than $\varepsilon_e$ and $\varepsilon_{th}$ in Expression (10) are included in the inherent strain. In contrast, in the case of the structure subjected to plastic working, the inherent strain is plastic strain itself, not including transformation strain, and creep strain. In other words, when plastic deformation occurs in the object, shape change occurs but volume change does not occur. Therefore, the following expression is established.

$$\varepsilon_v + \varepsilon_{11} + \varepsilon_{22} + \varepsilon_{33} = 0 \quad (11)$$

Simply, $\varepsilon_v$ represents volume strain, and suffixes (11, 22, 33) correspond to the respective components (r, θ, z) in the case of a cylindrical coordinate system, respectively, and correspond to the respective components (x, y, z) in the case of an orthogonal coordinate system, respectively.

A distribution function expressed by Expression (8) is defined in detail. When the distribution function is a multi-order polynomial, it is expressed by Expression (12). The distribution function can also be defined as a trigonometrical series.

[Equation 6]

$$\varepsilon_{11} = \sum_{i=0}^{m} \sum_{j=0}^{n} a_{ij} x^i y^j \quad (12)$$

$$\varepsilon_{22} = \sum_{i=0}^{m} \sum_{j=0}^{n} b_{ij} x^i y^j$$

$$\varepsilon_{33} = \sum_{i=0}^{m} \sum_{j=0}^{n} c_{ij} x^i y^j$$

A case where the distribution function is a multi-order polynomial will be described herein. An incompressible constraint condition expressed by Expression (11) is introduced into the distribution function of Expression (12). Thus, the distribution function is optimized for the plastic-worked structure. The optimized distribution function is expressed by the following expression.

[Equation 7]

$$\varepsilon_{11} = \sum_{i=0}^{m} \sum_{j=0}^{n} a_{ij} x^i y^j \quad (13)$$

$$\varepsilon_{22} = \sum_{i=0}^{m} \sum_{j=0}^{n} b_{ij} x^i y^j$$

$$\varepsilon_{33} = \sum_{i=0}^{m} \sum_{j=0}^{n} (-a_{ij} - b_{ij}) x^i y^j$$

In addition, even when the structure is subjected to welding or heat treatment, most of the inherent strain occurring in the structure may be plastic strain. Even in such a case, the distribution function of Expression (13) introduced by the incompressible constraint condition can be used. That is, the residual stress estimation method according to the present embodiment can be used not only for the plastic-worked structure but also for the structure in which the inherent strain occupied mainly by the plastic strain occurs.

As indicated in Expression (13), a parameter $c_{ij}$ becomes unnecessary by addition of the incompressible constraint condition.

Next, the CPU 111 optimizes the parameters of the distribution function (Step S4). Hereinafter, the processing of Step S4 will be described in detail.

The CPU 111 first determines H in Expression (9). The procedure thereof is as follows.

(a) $a=[1, 0, 0, \ldots, 0]^T$ is set and $\varepsilon_0 = Ma$ is obtained.

(b) Expression (4) is solved and "u" is obtained.

(c) $\varepsilon$ is obtained by Expression (3).

(d) $\sigma$ is obtained by Expression (1).

(e) N values corresponding to the residual stress measurement point are extracted from the components of $\sigma$ and the extracted values are set to a first column of H.

(f) $a=[0, 1, 0, \ldots, 0]^T$ is set and a second column of H is also obtained in the same procedure of (b) to (f).

Next, the CPU 111 determines "a" such that R of Expression (7) is the minimum. Accordingly, the distribution function parameters are optimized.

Further, the CPU 111 calculates an estimated value of the residual stress (Step S5).

In the processing of Step S5, first, the CPU 111 obtains the inherent strain of a certain point by Expression (8). Further, the CPU 111 obtains "u" by solving Expression (4) and the obtained "u" is applied to Expression (3) to obtain $\varepsilon$. Then, the obtained s is applied to Expression (1) to obtain $\sigma$.

Next, the CPU 111 displays the estimated value of the obtained residual stress on the display unit 13 (Step S6).

After Step S6, the CPU 111 ends the processing.

With the configuration described above, it is possible to accurately reflect the physical property that the volume does not change in the plastic working, to the distribution function, and to obtain the estimated value of the residual stress of the plastic-worked structure with high accuracy.

Other Embodiments

In the above-described embodiment, there has been described a configuration in which the residual stress is measured from the cut piece of the structure and the parameter of the distribution function is optimized such that a difference between the measured residual stress and the residual stress calculated by the distribution function is the minimum, but the invention is not limited thereto. A configuration in which the released strain (elastic strain) is measured from the cut piece of the structure and the parameter of the distribution function is optimized such that a difference between the measured released strain and the elastic strain calculated by the distribution function is the minimum may be adopted.

(Evaluation Test)

The inventor(s) conducted performance evaluation tests of the residual stress estimation method described in the above embodiments. In this evaluation test, a correct answer value of the residual stress conducted a numerical experiment by a residual stress estimation method (hereinafter, referred to as a "proposed method"), in which the incompressible constraint condition is introduced, using the results of the existing FEM (finite element method) analysis, and compared the correct answer value with the numerical experiment results.

Figure 8:
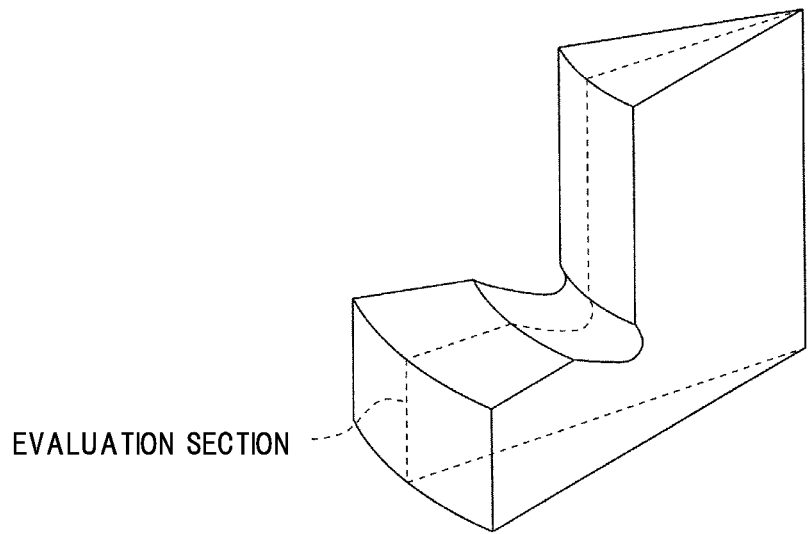
FIG. 8 is a perspective view illustrating an analysis model used for an evaluation test.

In the FEM analysis, when the roll processing conditions of a real machine were simulated and a roll was rotated while considering a contact with the fillet, the residual stress was analyzed in a fillet portion of the crank shaft. FIG. 8 is a perspective view illustrating an analysis model. An axially symmetric shape was considered, the analysis model was set at 30° in the circumferential direction, and symmetric conditions in the circumferential direction were applied to a circumferential end face. Further, a center plane (section at the position of 15°) in the circumferential direction of the analysis model was taken as an evaluation section, and the analysis results in this evaluation section were used as the correct answer value.

Figure 9A:
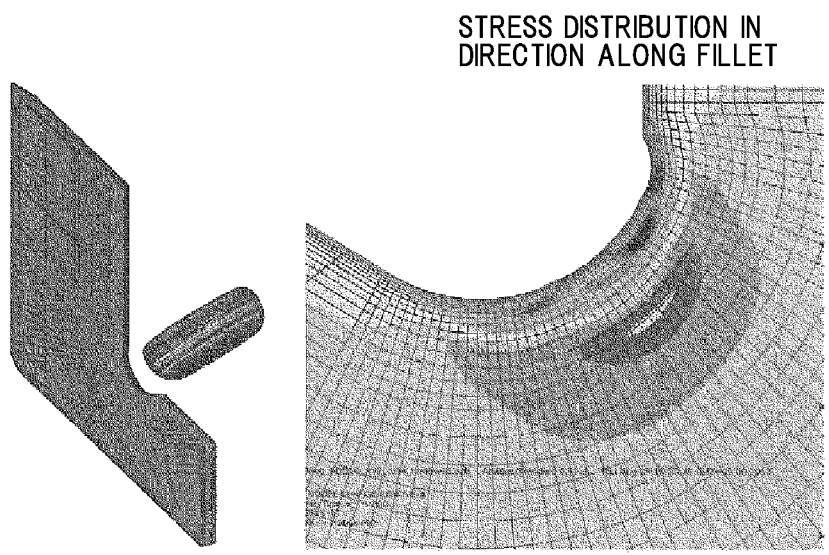
FIG. 9A is a diagram illustrating an analysis model of a T piece.
Figure 9B:
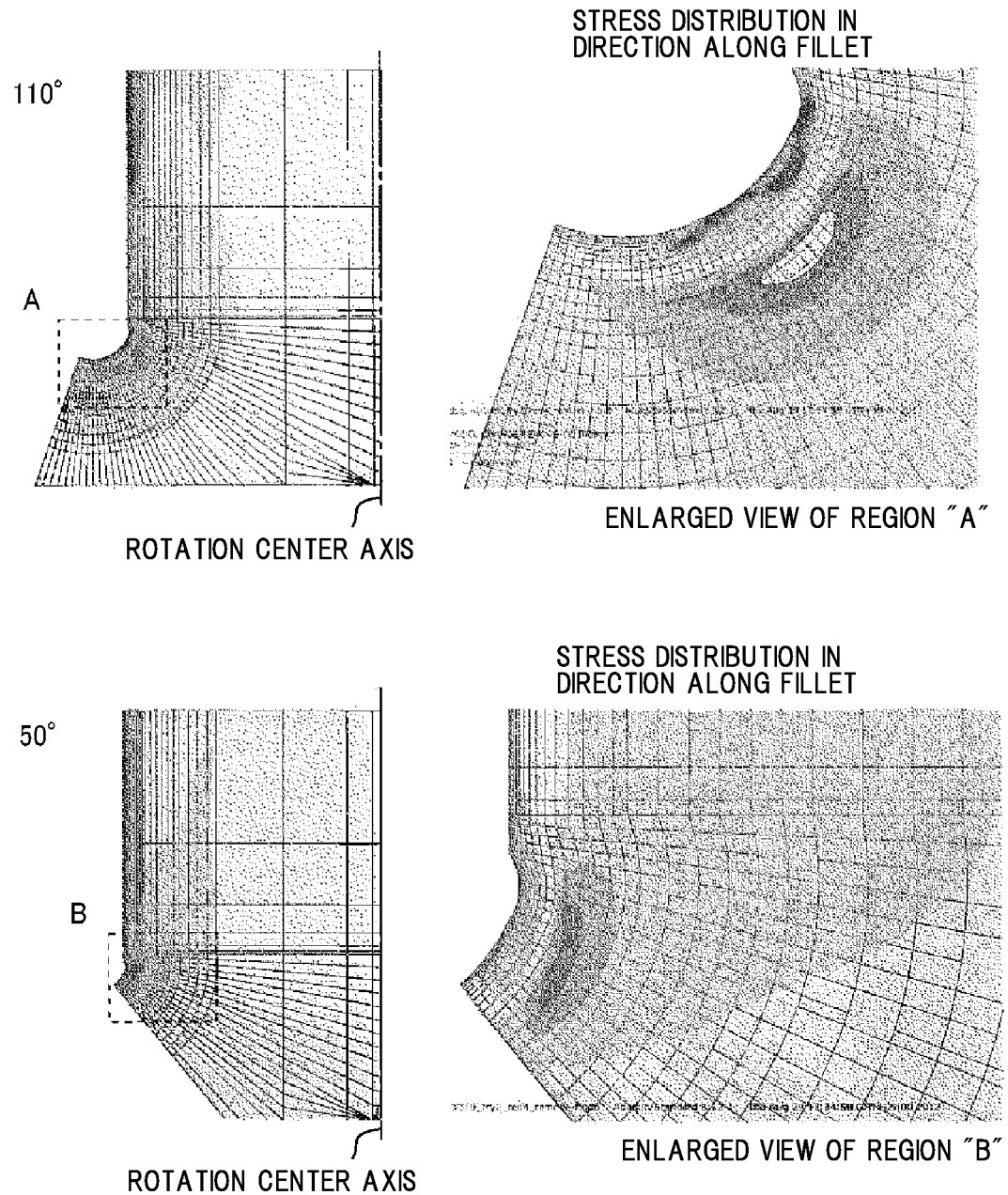
FIG. 9B is a diagram illustrating an analysis model of the C piece.

In the numerical experiment, it is considered to use an inherent strain value under the same condition (position, component) as an actually measuring case. After simulating roll processing, T and C pieces were collected in the FEM analysis and strain released analysis was performed to obtain residual stress of the cut piece corresponding to actual measurement. FIG. 9A is a diagram illustrating an analysis model of a T piece, and FIG. 9B is a diagram illustrating an analysis model of a C piece. For the residual stress value of the cut piece, a value at an element center of gravity was used.

(1) Test 1

Numerical experiment was conducted by the proposed method in the case where the measured value $\sigma_r$ in the r-direction and the measured value $\sigma_z$ in the z-direction were obtained in the T piece and the measured value $\sigma_r$ in the r-direction and the measured value $\sigma_\theta$ in the z-direction were obtained in the C piece. In addition, as a comparative experiment, each of the measured values obtained under the same condition as the proposed method was applied to a residual stress estimation method (hereinafter, referred to as a "comparative method") based on the inherent strain method which does not consider the incompressible constraint condition, and thus numerical experiments were conducted.

Figure 10A:
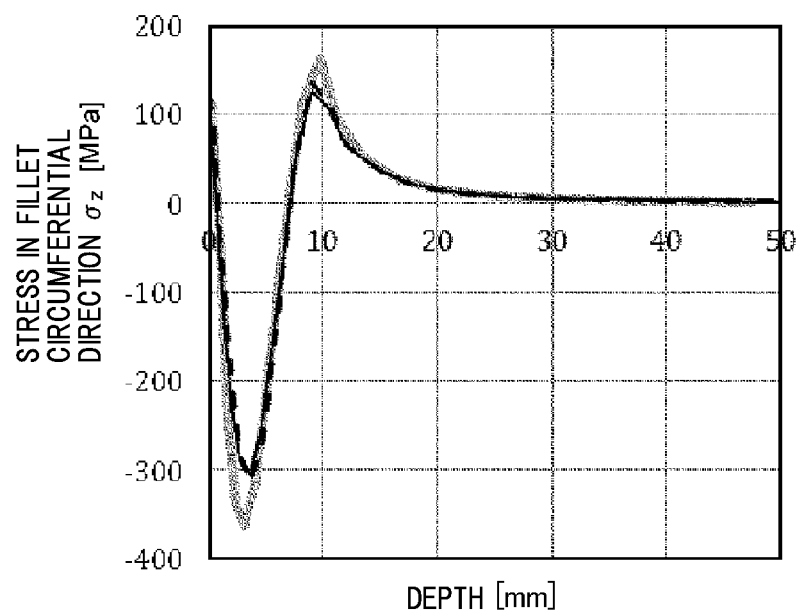
FIG. 10A is a graph illustrating estimation results of residual stress in a fillet circumferential direction in Test 1.
Figure 10B:
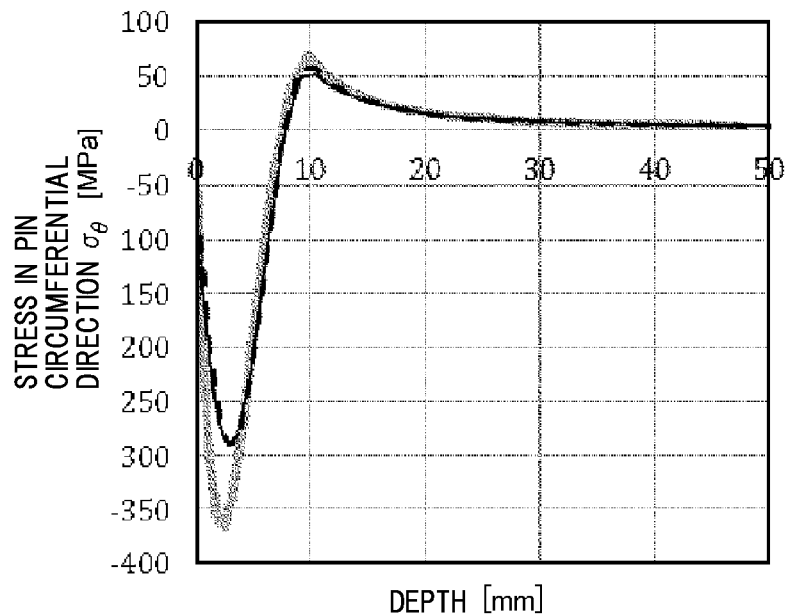
FIG. 10B is a graph illustrating estimation results of residual stress in a pin circumferential direction in Test 1.
Figure 10C:
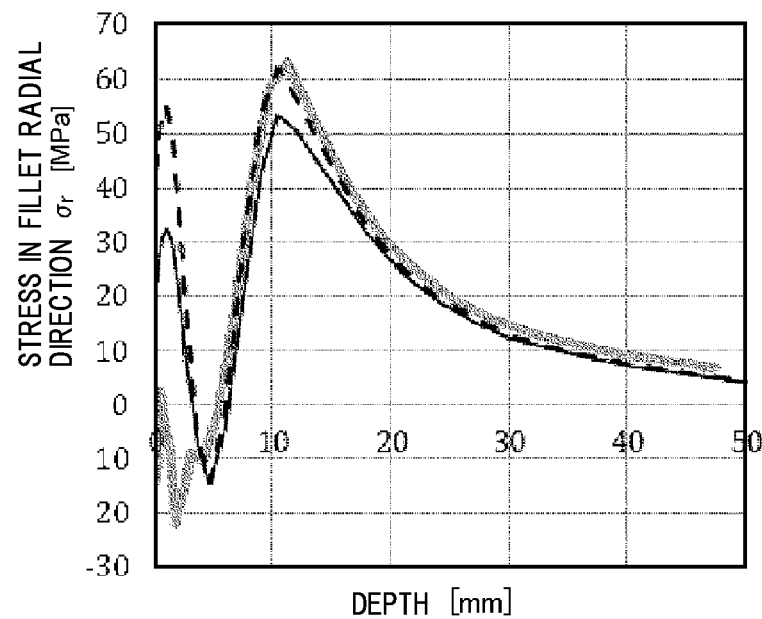
FIG. 10C is a graph illustrating estimation results of residual stress in a fillet radial direction in Test 1.

FIGS. 10A to 10C are graphs illustrating the results of Test 1. FIG. 10A is a graph illustrating estimation results of residual stress in a fillet circumferential direction, FIG. 10B is a graph illustrating estimation results of residual stress in a pin circumferential direction, and FIG. 10C is a graph illustrating estimation results of residual stress in a fillet radial direction. In FIGS. 10A to 10C, a vertical axis shows the magnitude of the residual stress, and a horizontal axis shows the depth from the surface. Further, in each graph, the gray solid line shows the correct answer value, the dashed line shows the results of numerical experiment by the comparative method, and the black solid line shows the results of numerical experiment by the proposed method.

Although there is no large difference in the results between the proposed method and the comparative method, the proposed method obtains the residual stress in the fillet radial direction closer to the correct answer value in the vicinity of the surface, as compared with the comparative method. By considering incompressibility, it is possible to estimate the residual stress with high accuracy.

(2) Test 2

The case where only the T piece was used and the residual stress was estimated using the shear component was investigated. Numerical experiment was conducted by the proposed method in the case where the measured value $\sigma_r$ in the r-direction, the measured value $\sigma_z$ in the z-direction, and the measured value $\tau_{rz}$ of the shear component were obtained in the T piece. In addition, as a comparative experiment, each of the measured values obtained under the same condition as the proposed method was subjected to numerical experiment by the comparative method.

Figure 11A:
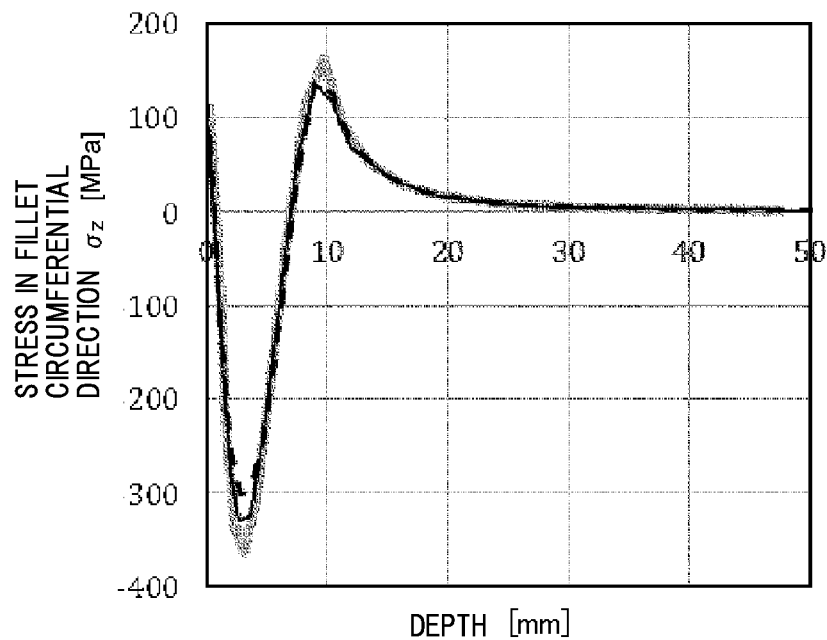
FIG. 11A is a graph illustrating estimation results of residual stress in the fillet circumferential direction in Test 2.
Figure 11B:
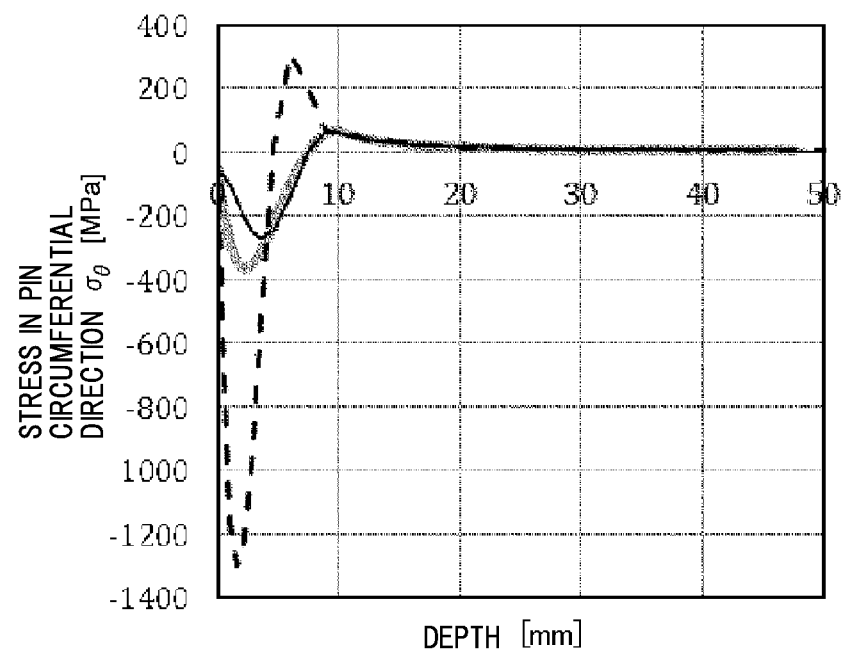
FIG. 11B is a graph illustrating estimation results of residual stress in the pin circumferential direction in Test 2.
Figure 11C:
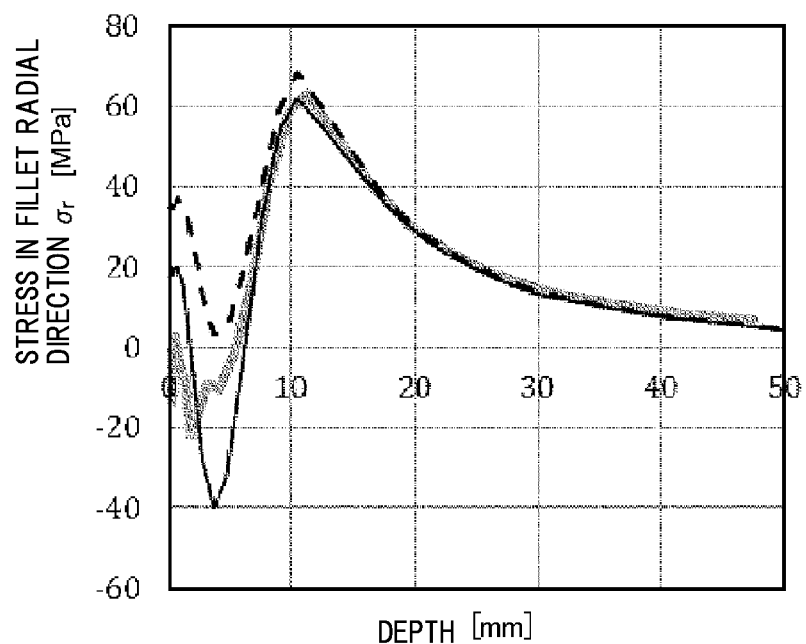
FIG. 11C is a graph illustrating estimation results of residual stress in the fillet radial direction in Test 2.

FIGS. 11A to 11C are graphs illustrating the results of Test 2. FIG. 11A is a graph illustrating estimation results of residual stress in a fillet circumferential direction, FIG. 11B is a graph illustrating estimation results of residual stress in a pin circumferential direction, and FIG. 11C is a graph illustrating estimation results of residual stress in a fillet radial direction. In FIGS. 11A to 11C, a vertical axis shows the magnitude of the residual stress, and a horizontal axis shows the depth from the surface. Further, in each graph, the gray solid line shows the correct answer value, the dashed line shows the results of numerical experiment by the comparative method, and the black solid line shows the results of numerical experiment by the proposed method.

In the proposed method, the residual stress in the θ-direction can also be accurately estimated to the same extent as in Test 1 even when the measurement component in the θ-direction other than the cut face of the T piece is not used. On the other hand, the estimation accuracy of the residual stress in the θ-direction extremely deteriorates in the comparative method. By considering the incompressible constraint condition, it can be seen that the estimation accuracy is improved.

(3) Test 3

The case where only the T piece was used and the residual stress was estimated without using the shear component was investigated. Numerical experiment was conducted by the proposed method in the case where the measured value $\sigma_r$ in the r-direction and the measured value $\sigma_z$ in the z-direction were obtained in the T piece. In addition, as a comparative experiment, each of the measured values obtained under the same condition as the proposed method was subjected to numerical experiment by the comparative method.

Figure 12A:
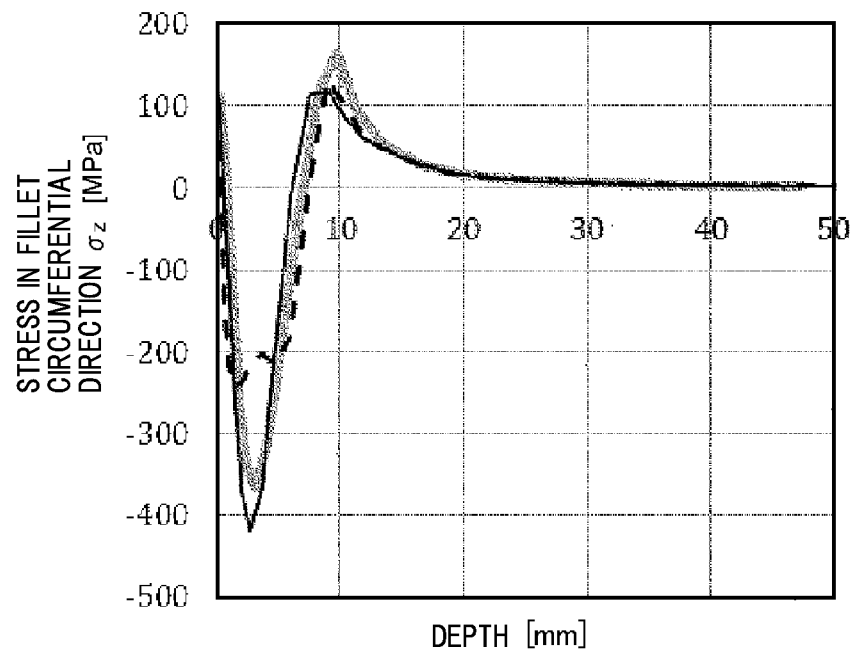
FIG. 12A is a graph illustrating estimation results of residual stress in the fillet circumferential direction in Test 3.
Figure 12B:
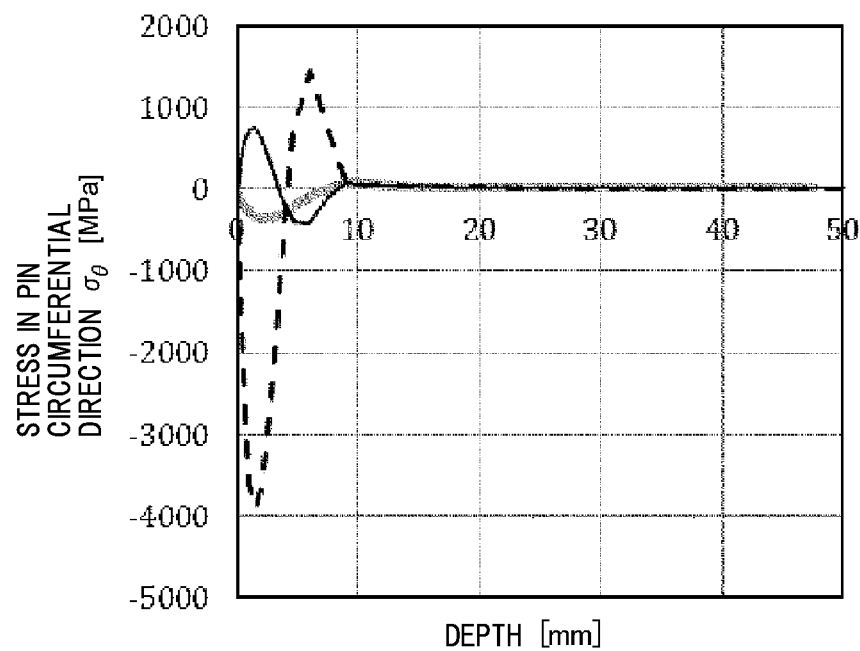
FIG. 12B is a graph illustrating estimation results of residual stress in the pin circumferential direction in Test 3.
Figure 12C:
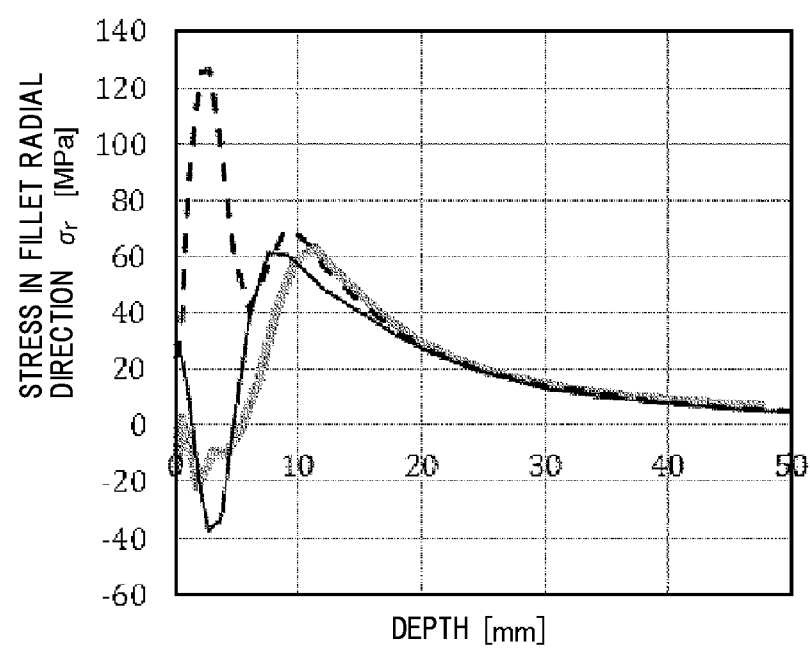
FIG. 12C is a graph illustrating estimation results of residual stress in the fillet radial direction in Test 3.

FIGS. 12A to 12C are graphs illustrating the results of Test 2. FIG. 12A is a graph illustrating estimation results of residual stress in a fillet circumferential direction, FIG. 12B is a graph illustrating estimation results of residual stress in a pin circumferential direction, and FIG. 12C is a graph illustrating estimation results of residual stress in a fillet radial direction. In FIGS. 12A to 12C, a vertical axis shows the magnitude of the residual stress, and a horizontal axis shows the depth from the surface. Further, in each graph, the gray solid line shows the correct answer value, the dashed line shows the results of numerical experiment by the comparative method, and the black solid line shows the results of numerical experiment by the proposed method.

In both the proposed method and the comparative method, although the estimation accuracy of the residual stress in the θ-direction not using the measured value has decreased, the accuracy degradation is low in the proposed method compared with the comparative method. In addition, the estimation accuracy of the residual stress in the r-direction and the z-direction using the measured value is also extremely low in the comparative method. On the other hand, the estimation accuracy of the residual stress in the r-direction and the z-direction is good in the proposed method. From this result, it can also be seen that the estimation accuracy is improved by considering the incompressible constraint condition.

INDUSTRIAL APPLICABILITY

The residual stress estimation method and the residual stress estimation device of the present invention are useful as a residual stress estimation method and a residual stress estimation device for estimating the residual stress of a structure based on an inherent strain method.

The present application is based on Japanese Patent Application (Patent Application No. 2015-043081) filed on Mar. 5, 2015, the contents of which are incorporated herein by reference.

DESCRIPTION OF REFERENCE NUMERALS AND SIGNS

1: residual stress estimation device
10: computer
12: input unit
13: display unit
110: residual stress estimation program
111: CPU
115: hard disk
116: input/output interface
117: image output interface
200: crank shaft (structure)
400: T piece (cut piece)
401: cut face
500: C piece (cut piece)
501: cut face

The invention claimed is:

1. A residual stress estimation method comprising steps of:
   determining a parameter of a distribution function, which is introduced as a constraint condition that a structure does not undergo volume change before and after working, such that an error between a measured value of residual stress or elastic strain of a plastic-worked structure measured after the structure has been cut and a calculated value of residual stress or elastic strain at a measurement position is a minimum, based on the measured value regarding residual stress of the structure, the parameter being included in the distribution function; and
   estimating the residual stress of the structure based on the distribution function for which the parameter is determined.

2. The residual stress estimation method according to claim 1, further comprising a step of:
   acquiring three different components regarding any one of residual stress and elastic strain measured from one cut piece collected from the structure, as the measured value.

3. The residual stress estimation method according to claim 2, wherein the step of acquiring the three components as the measured value includes acquiring direction components in two directions perpendicular to each other regarding any one of the residual stress and the elastic strain measured in one cut face of the cut piece and a shear component in the cut face, as the measured value.

4. The residual stress estimation method according to claim 2, wherein the step of acquiring the three components as the measured value includes, when assumed that the inherent strain is uniformly distributed in one direction, acquiring three components regarding any one of the residual stress and the elastic strain measured in a cut face intersecting the one direction, as the measured value.

5. The residual stress estimation method according to claim 1, further comprising a step of:
   when assumed that the inherent strain is uniformly distributed in one direction, acquiring the measured value measured from one cut piece with respect to one region in which the inherent strain is uniformly distributed.

6. A residual stress estimation device comprising:
   a processor; and
   a memory that stores a program that, when executed by the processor, allows the device to:
   determine a parameter of a distribution function, which is introduced as a constraint condition that a structure does not undergo volume change before and after working, such that an error between a measured value of residual stress or elastic strain of a plastic-worked structure measured after the structure has been cut and a calculated value of residual stress or elastic strain at a measurement position is a minimum, based on the measured value regarding residual stress of the structure, the parameter being included in the distribution function; and acquire an estimated value of the residual stress in the structure based on the distribution function for which the parameter is determined;

the residual stress estimation device further comprising a display that displays the estimated value.

\* \* \* \* \*